United States Patent
Yang et al.

(10) Patent No.: US 7,136,287 B2
(45) Date of Patent: Nov. 14, 2006

(54) CLIP FOR MOUNTING HEAT SINK TO CIRCUIT BOARD

(75) Inventors: Chih-Hao Yang, Tu-chen (TW); Ching-Bai Hwang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 149 days.

(21) Appl. No.: 10/900,767

(22) Filed: Jul. 27, 2004

(65) Prior Publication Data

US 2005/0068742 A1 Mar. 31, 2005

(30) Foreign Application Priority Data

Sep. 30, 2003 (TW) .............................. 92217523 U

(51) Int. Cl.
*H05K 7/20* (2006.01)

(52) U.S. Cl. ...................... 361/704; 361/719; 257/712; 257/718; 257/727; 174/16.1; 165/80.3

(58) Field of Classification Search ................ 361/704; 257/718; 411/508; 24/292, 297, 453, 458
See application file for complete search history.

(56) References Cited

U.S. PATENT DOCUMENTS

| | | | | |
|---|---|---|---|---|
| 5,377,745 A | * | 1/1995 | Hsieh ......................... | 165/80.3 |
| 5,384,940 A | | 1/1995 | Soule et al. | |
| 5,771,559 A | * | 6/1998 | Cipolla et al. ................. | 29/453 |
| 5,969,947 A | * | 10/1999 | Johnson et al. ............. | 361/704 |
| 6,112,378 A | * | 9/2000 | Lee .............................. | 24/458 |
| 6,273,185 B1 | * | 8/2001 | Lin et al. .................... | 165/185 |
| 6,496,372 B1 | * | 12/2002 | Davison et al. ............. | 361/704 |
| 6,883,935 B1 | * | 4/2005 | Lassovsky .................. | 362/283 |

FOREIGN PATENT DOCUMENTS

| | | |
|---|---|---|
| TW | 406824 | 1/1999 |
| TW | 443715 | 6/2001 |
| TW | 468941 | 12/2001 |

\* cited by examiner

*Primary Examiner*—Boris Chervinsky
(74) *Attorney, Agent, or Firm*—Wei Te Chung

(57) ABSTRACT

A clip (10) includes a body (12) including spaced first and second end portions, a first locking part (20) extending from the first end portion for attaching to a heat sink (80), and a second locking part (30) extending from the second end portion for attaching to a circuit board (50). The first locking part includes a pin (21), a pair of C-shaped spring portions (22), and a compressible mounting portion (23). The spring portions and the mounting portion are for cooperatively sandwiching the heat sink therebetween. The second locking part includes a taper head (30) and a neck (31). The second locking part engages with the circuit board in the neck. The first locking part offsets from the second locking part in a vertical direction. The heat sink of which the mounting holes offset from the mounting holes of the circuit board is therefore fitable to the circuit board.

17 Claims, 3 Drawing Sheets

CLIP FOR MOUNTING HEAT SINK TO CIRCUIT BOARD

BACKGROUND OF THE INVENTION

1. Field of the Invention

The present invention relates to a clip, and particularly to a clip which can readily and conveniently mount a large heat sink to an electronic component adjacent which a plurality of electronic components is located.

2. Related Art

As computer technology continues to advance, electronic components of computers are being made to provide faster operational speeds and greater functional capabilities. When an electronic component operates at high speed in a computer enclosure, its temperature can increase greatly. It is desirable to dissipate the generated heat quickly, for example by using a heat sink attached to the electronic component in the enclosure. This allows the electronic component in the enclosure to function within their normal operating temperature ranges, thereby assuring the quality of data management, storage and transfer. Oftentimes, a clip is required for mounting the heat sink to the electronic component.

A wide variety of heat dissipating devices and clips are available in the prior art. For example, U.S. Pat. No. 5,384,940 discloses a kind of clip for mounting a heat sink to an electronic package. The clip comprises a cylindrical top, a shaft and a compressible point. A spring is disposed around the shaft. In assembly, the point extends through aligned two holes in the heat sink and a printed circuit board and compresses as it passes into two holes and flexes back to an expanded position after it exits the printed circuit board hole thereby holding the heat sink to the board with the electronic component therebetween.

However, with electronic components operating more and more fast the electronic components generate more and more heat. Heat dissipation efficiency of heat sinks are therefore required more and more high. One method to increase heat dissipation efficiency of a heat sink is to increase volume of the heat sink. Location of mounting holes of the heat sink is therefore changed. Since a plurality of electronic components is mounted on the circuit board it is inconvenient to change location of the mounting holes of the circuit board to fit the heat sink which has a large size and has mounting holes not aligned with the mounting holes of the circuit board. This results in inconveniency of using the heat sink having a large size.

SUMMARY OF THE INVENTION

Accordingly, an object of the present invention is to provide a clip which can readily and conveniently mount a heat sink to a circuit board of which mounting holes are not aligned with mounting holes of the heat sink.

To achieve the above-mentioned object, a clip in accordance with a preferred embodiment of the present invention comprises a body comprising spaced first and second end portions, a first locking part extending from the first end portion for attaching to a heat sink, and a second locking part extending from the second end portion for attaching to a circuit board. The first locking part comprises a pin, a pair of C-shaped spring portions formed on opposite side of a lower portion of the pin, and a compressible mounting portion formed at a top end of the pin. The spring portions and the mounting portion are for cooperatively sandwiching the heat sink therebetween. The second locking part comprises a taper head and a neck formed between the body and the head. The second locking part engages with the circuit board in the neck. The first locking part offsets from the second locking part in a vertical direction. The heat sink of which the mounting holes offset from the mounting holes of the circuit board is therefore fitable to the electronic board.

Other objects, advantages and novel features of the present invention will be drawn from the following detailed description of a preferred embodiment of the present invention with attached drawings, in which:

DETAILED DESCRIPTION OF THE INVENTION

Figure 1:
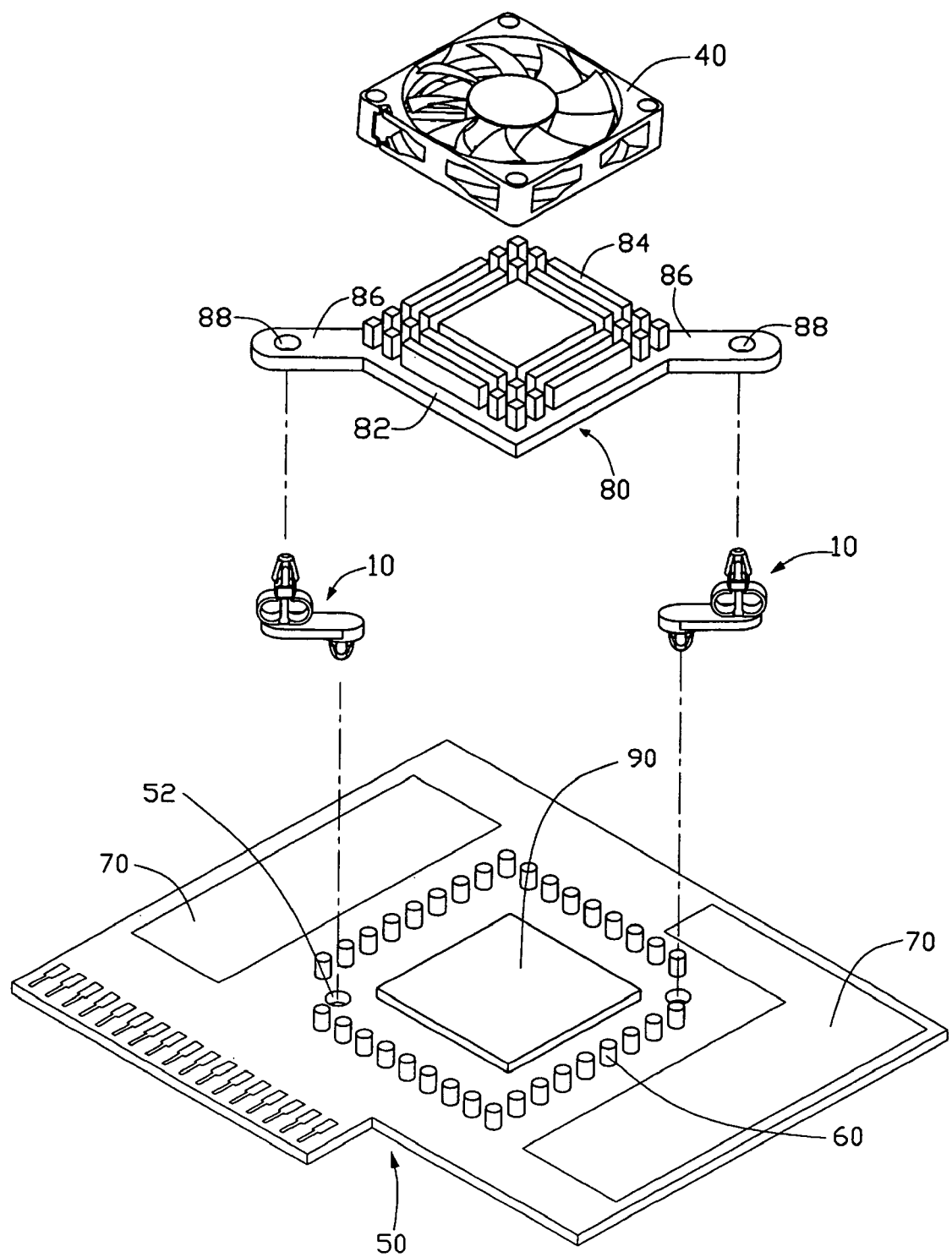
FIG. 1 shows a pair of clips in accordance with a preferred embodiment of the present invention for securing a heat sink to a circuit board, together with a fan.

FIG. 1 shows a pair of clips 10 in accordance with a preferred embodiment of the present invention for securing a heat sink 80 to a large electronic component 90 which is mounted on a circuit board 50. The circuit board 50 defines a pair of mounting holes 52 adjacent to a pair of diagonal corners of the large electronic component 90. A plurality of small electronic components 60 is mounted on the circuit board 50 surrounding the large electronic component 90. Circuits 70 are installed in the circuit board 50. In the present invention, the circuit board 50 can be a display card or other cards. The large electronic component 90 is a wafer. It is inconvenient to change locations of the mounting holes 52 since there is a plurality of small electronic components 60 and circuits 70 adjacent to the mounting holes 52.

The heat sink 80 comprises a rectangular base 82 and a plurality of fins 84 extending upwardly from the base 82. A pair of mounting arms 86 extends outwardly from a pair of diagonal corner of the base 82. Each mounting arm 86 defines a mounting hole 88. A fan 40 is for mounting on the heat sink 80.

Figure 2:
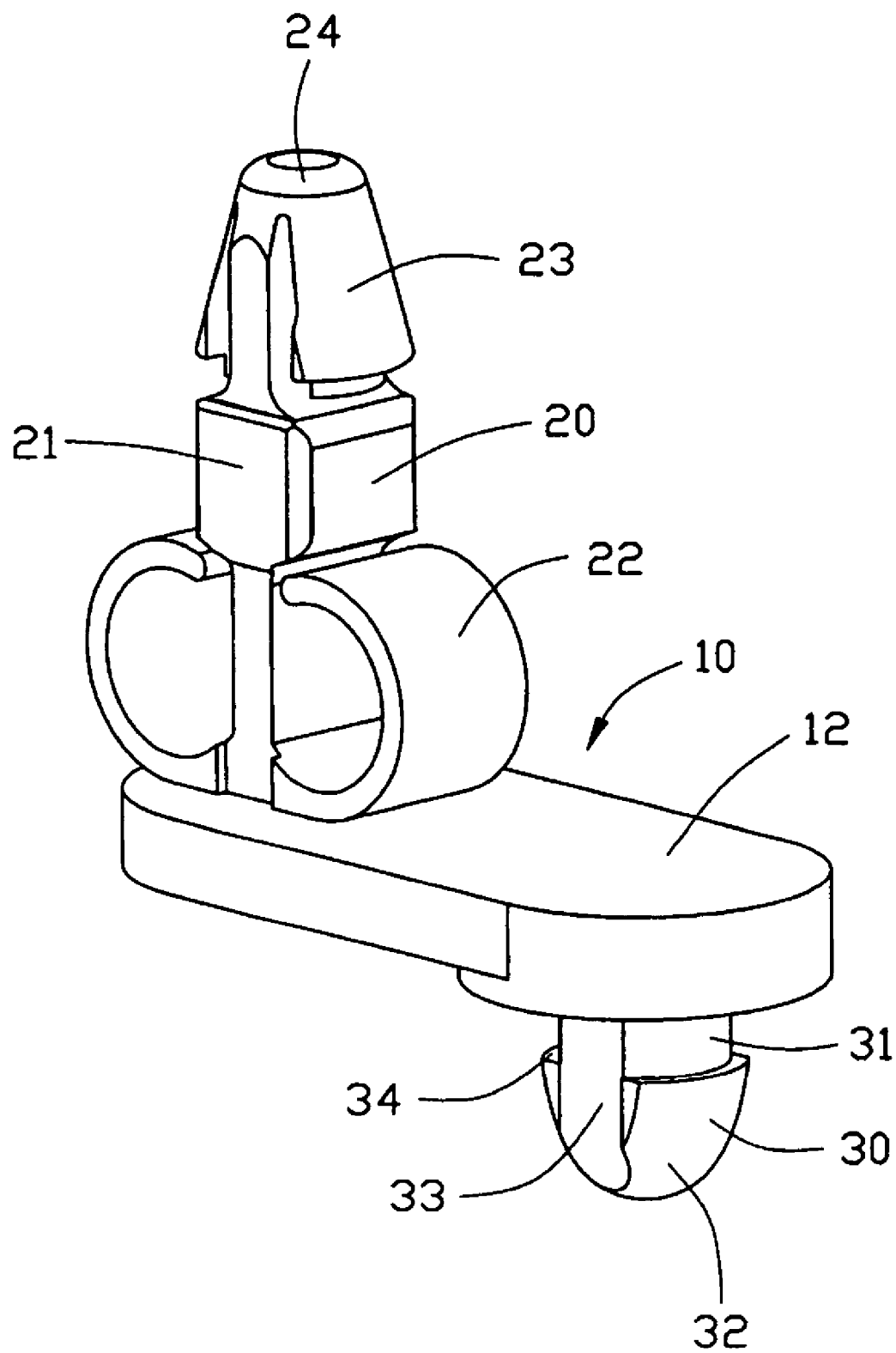
FIG. 2 is an enlarged isometric view of the clip of FIG. 1.

Referring also to FIG. 2, one clip 10 will be described in detail since both are identical in construction, function and operation. The clip 10 comprises a horizontal body 12, a first locking part 20 extending upwardly from one end portion of the body 12, and a second locking part 30 extending downwardly from an opposite end portion of the body 12. The first locking part 20 comprises a pin 21 extending upwardly from the body 12. A pair of C-shaped spring portions 22 is formed on opposite sides of a lower portion of the pin 21. Each spring portion 22 comprises a fixed end integrally formed with the body 12 and the bottom end of the pin 21, and a free end adjacent to a middle portion of the pin 21. An approximate taper spring mounting portion 23 is formed in a free end portion of the pin 21. The mounting portion 23 comprises a pair of compressible prongs extending downwardly from a top end 24 of the pin 21. A size of a bottom surface of the mounting portion 23 is larger than a diameter of the mounting hole 88 of the heat sink 80. The second locking part 30 comprises an approximate taper head 32 and a neck 31 formed between the head and the body 12. A step 34 is therefore formed at a junction of the neck 31 and the head 32. A size of the step 34 is larger than a diameter of the mounting hole 52 of the circuit board 50. A vertical slot 33 is defined in the head 32 and the neck 31 to improve compressibility of the second locking part 30.

Figure 3:
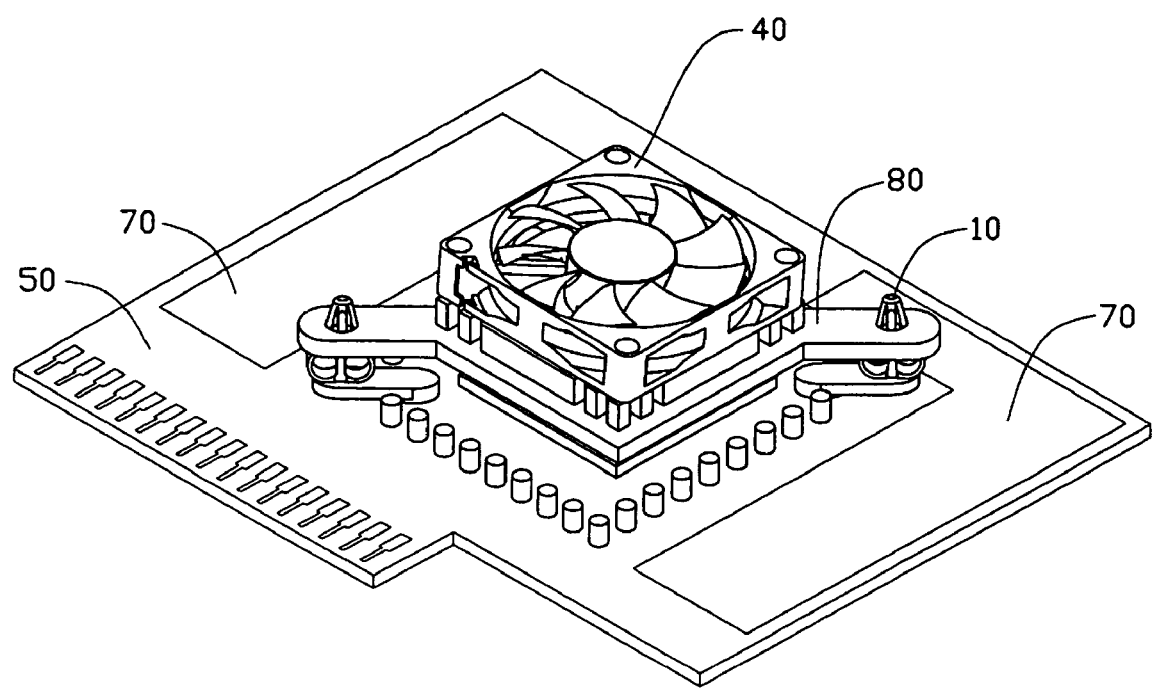
FIG. 3 is an assembled view of FIG. 1.

Referring also to FIG. 3, in assembly, the fan 40 is mounted on the heat sink 80 in a conventional means. The mounting portions 23 of the first locking parts 20 of the clips 10 extend through the mounting holes 88 of the heat sink 80, respectively. The arms 86 are therefore sandwiched between the bottom surfaces of the mounting portions 23 and the C-shaped spring portions 22. The taper heads 32 of the clips 10 then pass through the mounting holes 52 of the circuit board 50. The circuit board 50 is therefore engaged with the second locking parts 30 in the necks 31 and sandwiched between a bottom surface of the body 12 and the steps 34 of the taper heads 32. The combined 40 and heat sink 80 is thus firmly mounted on the wafer 90.

In the present invention, the first locking part 20 of the clip 10 offsets from the second locking part 30 of the clip 10 in a vertical direction corresponding to locations of the mounting holes 88, 52 of the heat sink 80 and the circuit board 50. The heat sink 80 of which the mounting holes 88 offset from the mounting holes 52 of the circuit board 50 is therefore fitable to the wafer 90 adjacent which the plurality of small electronic components 60 and circuits 70 locate.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A clip for mounting a heat sink to a circuit board on which a heat generating component is installed, the clip comprising:
   a body comprising spaced first and second end portions in a first direction;
   a first locking part extending from the first end portion in a second direction and adapted for attaching to the heat sink; and
   a second locking part extending from the second end portion in a third direction and adapted for attaching to the circuit board;
   wherein the first locking part comprises a pin, a spring portion formed at a lower portion of the pin, and a mounting portion formed at a top end of the pin, the spring portion and the mounting portion for cooperatively sandwiching the heat sink therebetween.

2. The clip as claimed in claim 1, wherein the spring portion is C-shaped and comprises a fixed end integrally formed with a bottom end of the pin, and a free end adjacent to a middle portion of the pin.

3. The clip as claimed in claim 1, wherein the mourning portion is taper shaped and comprises a pair of compressible prongs extending downwardly from the top end of the pin.

4. The clip as claimed in claim 1, wherein the second locking part comprises a taper head and a neck formed between the body and the taper head, the taper head and the body for cooperatively sandwiching the circuit board therebetween in the neck.

5. The clip as claimed in claim 4, wherein a slot is defined in the head and the neck along the third direction to improve compressibility of the second locking part.

6. A heat dissipating device assembly comprising:
   a circuit board having an electronic component installed thereon and a first engaging portion adjacent the electronic component, the first engaging portion defining a first central line;
   a heat sink mounted on the electronic component, the heat sink providing a second engaging portion, the second engaging portion defining a second central line not aligning with said first central line; and
   a pair of individual clips for mounting the heat sink to the circuit board, each of the clips comprising:
      a first locking part engaging with the second engaging portion of the heat sink; and
      a second locking part engaging with the first engaging portion of the circuit board.

7. The heat dissipating device assembly as claimed in claim 6, wherein the heat sink comprises a base contacting the electronic component, a plurality of fins extending from the base, and an arm extending from the base, and the second engaging portion comprises a mounting hole defined in the arm.

8. The heat dissipating device assembly as claimed in claim 7, wherein the first locking part comprises a pin, a pair of spring portions formed on opposite sides of a lower portion of the pin, and a compressible mounting portion formed at a top end of the pin, the spring portions and the mounting portion cooperatively sandwiching the arm of the heat sink therebetween.

9. The heat dissipating device assembly as claimed in claim 8, wherein the spring portion is C-shaped and comprises a fixed end integrally formed with a bottom end of the pin, and a free end adjacent to a middle portion of the pin.

10. The heat dissipating device assembly as claimed in claim 8, wherein the mounting portion is taper shaped and comprises a pair of prongs extending downwardly from the top end of the pin.

11. The heat dissipating device assembly as claimed in claim 6, wherein the first engaging portion of the circuit board comprises a mounting hole, and the second locking part comprises a taper head extending through the mounting hole and a neck formed between the body and the head, the circuit hoard engaging with the second locking part in the neck and sandwiched between the body and the head.

12. The heat dissipating device assembly as claimed in claim 11, wherein a slot is defined in the head and the neck along the second direction to improve compressibility of the second locking part.

13. The heat dissipating device assembly as claimed in claim 6, wherein the body comprises spaced first and second end portions, the first locking part integrally extending from the first end portion and the second locking part integrally extending from the second end portion.

14. The heat dissipating device assembly as claimed in claim 6, further comprising a fan mounted on the heat sink.

15. A heat dissipation assembly comprising:
   a printed circuit board;
   a heat generating device located on the printed circuit board with a smaller horizontal dimension;
   a heat sink seated upon the heat generating device with a larger horizontal dimension; and
   at least one fastening device with an upper end adapted to be latchably engaged with the heat sink and a lower end adapted to be engaged with the printed circuit board; wherein
   said upper end is radially farther from the heat generating device than the lower end.

16. The heat dissipation assembly as claimed in claim 15, wherein said lower end extends through said printed circuit board.

17. The heat dissipation assembly as claimed in claim 15, wherein said upper end extends through a retention arm of the heat sink.

* * * * *